United States Patent [19]

Chen et al.

[11] Patent Number: 5,635,258
[45] Date of Patent: Jun. 3, 1997

[54] METHOD OF FORMING A BORON-DOPED DIAMOND FILM BY CHEMICAL VAPOR DEPOSITION

[75] Inventors: Chia-Fu Chen, Hsinchu; Sheng-Hsiung Chen, Taichung Hsien; Tsao-Ming Hong, Changhua Hsien, all of Taiwan

[73] Assignee: National Science Council, Taipei, Taiwan

[21] Appl. No.: 415,646

[22] Filed: Apr. 3, 1995

[51] Int. Cl.$^6$ .................. B05D 3/06; C23C 16/30
[52] U.S. Cl. .................. 427/577; 427/573; 427/575; 427/249; 427/255.1; 427/255.2; 427/122; 427/314
[58] Field of Search .................. 427/575, 573, 427/577, 249, 255.1, 255.2, 122, 314; 423/446

[56] References Cited

U.S. PATENT DOCUMENTS

| | | | |
|---|---|---|---|
| 4,740,263 | 4/1988 | Imai et al. | 156/613 |
| 5,353,737 | 10/1994 | Koyama et al. | 117/90 |

FOREIGN PATENT DOCUMENTS 05-299355  11/1993  Japan.

OTHER PUBLICATIONS

Chen et al, Thin Solid Films, 248 (1994) pp. 149–155.

Chen et al, "Boron–doped diamond films using trimethylborate as a dopant source in methane–carbon dioxide gas mixtures", 4th European Conference on Diamond, Diamond–like and Related Materials (Diamond Films '93) Sep. 20–24,1993 Albufeira, Portugal Diamond and Related Materials, vol. 3 No. 4–6 Apr. 1994, pp. 632–637.

Meilunas et al., "The Physical and Electrical Properties of Boron Doped Diamond Thin Films", Proc. 2nd Int'l. Conf. on Elec. Mats., Materials Research Society, 1990, pp. 609–614.

*Primary Examiner*—Roy V. King
*Attorney, Agent, or Firm*—Fish & Richardson P.C.

[57] ABSTRACT

A method of forming boron-doped diamond film by, chemical vapor deposition (CVD) utilizing two-component system reactant gas doped with trimethyl borate.

7 Claims, 6 Drawing Sheets

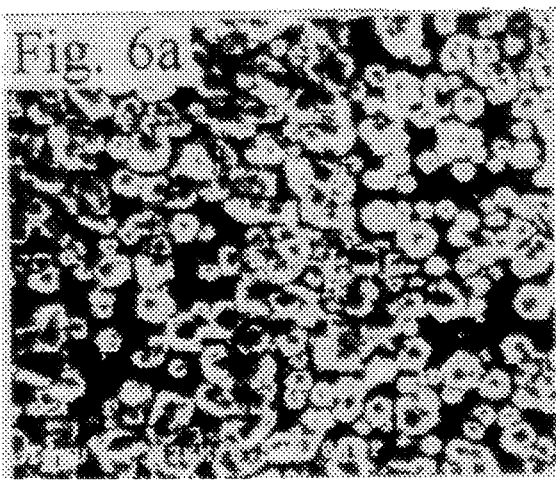 
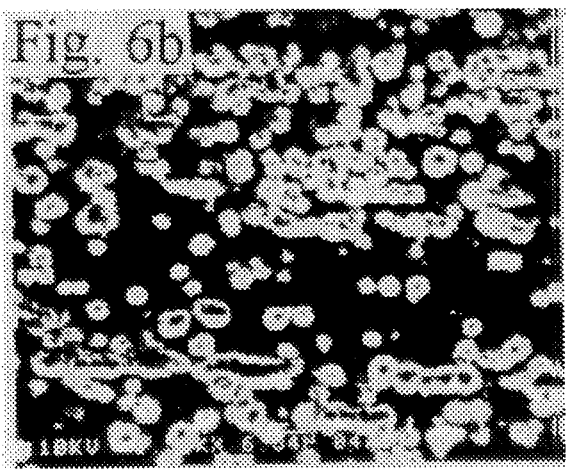 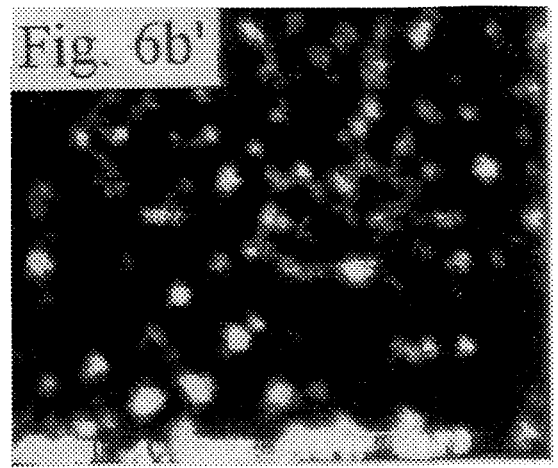
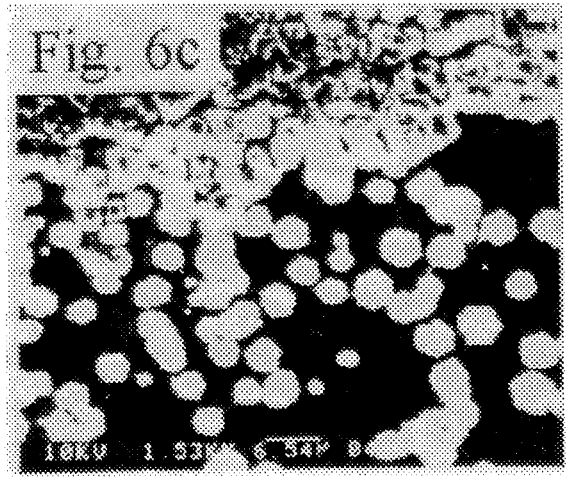 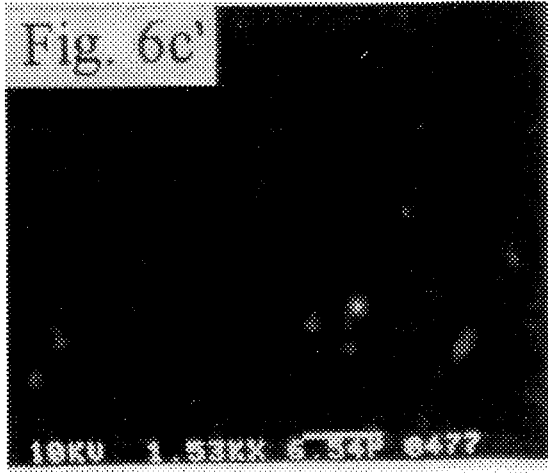

METHOD OF FORMING A BORON-DOPED DIAMOND FILM BY CHEMICAL VAPOR DEPOSITION

TECHNICAL BACKGROUND

The present invention relates to a method of forming a boron-doped diamond film by chemical vapor deposition, and in particular to a method of forming a boron-doped diamond film by chemical vapor deposition (CVD) utilizing a two-component system reactant gas doped with trimethylborate.

Recently, utilizing semiconductive diamond films to fabricate semiconductor electronics has attracted the attentions of many researchers. Due to their wider energy gap (5.45 eV at room temperature), which causes a higher breakdown field in the fabricated electronic components, together with their surface stability at high temperature (500°–600° C. in air, 1400°–1700° C. in inert gas), diamond films have been used in the fabrication of many electronic components operated in a high temperature ambient.

Although Schottky diodes and blue light emitting diodes have been fabricated recently from diamond films, the polycrystalline nature and high defect density of these diamond films prepared by CVD pose a severe limitation on their use in semiconductor electronic components.

In order to synthesize semiconducting diamond films of better quality, many fundamental studies of low pressure plasma CVD growth process have been done. Many reports have indicated that boron-doped diamond films can be successfully formed on a silicon substrate by the CVD process during low pressure synthesis if a boron-containing reactant gas system is used, and the deposited films are found to exhibit semiconducting properties similar to that of single crystal natural diamond. However, these low pressure syntheses have a disadvantage of using toxic diborane as a dopant source.

R. Meilunas et al have reported that the morphology of the deposited diamond films can be improved, if a $C_2H_2$—$O_2$—$H_2$ three-component system reactant gas which is doped with trimethyl borate is used as a raw material during the CVD process of depositing diamond films on the substrate (*The Physical and Electrical Properties of Boron Doped Diamond Thin Films*, Proc, 2nd Int'l cont, on Elec. Mats, 81990Material Research Society, 609–614). Although nontoxic trimethyl borate is used as a dopant source that is safer in operation, the doped boron is not uniformly distributed over the entire depth of the resultant diamond film. As a result, the diamond film fabricated by this method is not satisfactory.

SUMMARY OF THE INVENTION

It is therefore an object of the invention to provide a method of fabricating a boron-doped diamond film on a substrate, which can eliminate the above problems.

It has been found that when a two-component system reactant gas doped with trimethyl borate is used as raw material in the fabrication of diamond films by the CVD process, good quality diamond films, i.e. doped-boron uniformly distributed diamond films are obtained.

According to another aspect of the invention, during the fabrication of diamond films, the substrate is at a temperature of 180°–1000° C. and the reacting pressure is from 1 torr to 100 torr.

BRIEF DESCRIPTION OF THE DRAWINGS

The present invention can be more fully understood by reference to the following detailed description and accompanying drawings, in which:

FIG. 2a' is a SEM micrograph of diamond film fabricated on a scratched silicon substrate according to the method of Example 1;

FIG. 2b' is a SEM micrograph of the surface of a diamond film fabricated on a scratched silicon substrate according to the method of Example 2;

FIG. 2c' is a SEM micrograph of the surface of a diamond film fabricated according to the method of Example 3;

FIG. 4a' is a SIMS depth profile of the diamond film deposited on a n-type substrate according to the method of Example 2;

FIG. 4b' is a SIMS depth profile of a diamond film deposited on a n-type substrate according to the method of Example 3;

FIG. 6a is a SEM micrograph of the surface of a diamond film fabricated according to the method of Example 1;

FIG. 6a' is a color CL image of a diamond film fabricated according to the method of Example 1;

FIG. 6b is a SEM micrograph of the surface of a diamond film fabricated according to the method of Example 2;

FIG. 6b' is a color CL image of a diamond film fabricated according to the method of Example 2;

FIG. 6c is a SEM micrograph of the surface of a diamond film fabricated according to the method of Example 3; and FIG. 6c' is a color CL image of a diamond film fabricated according to the method of Example 3.

DETAILED DESCRIPTION OF THE INVENTION

Figure 1:
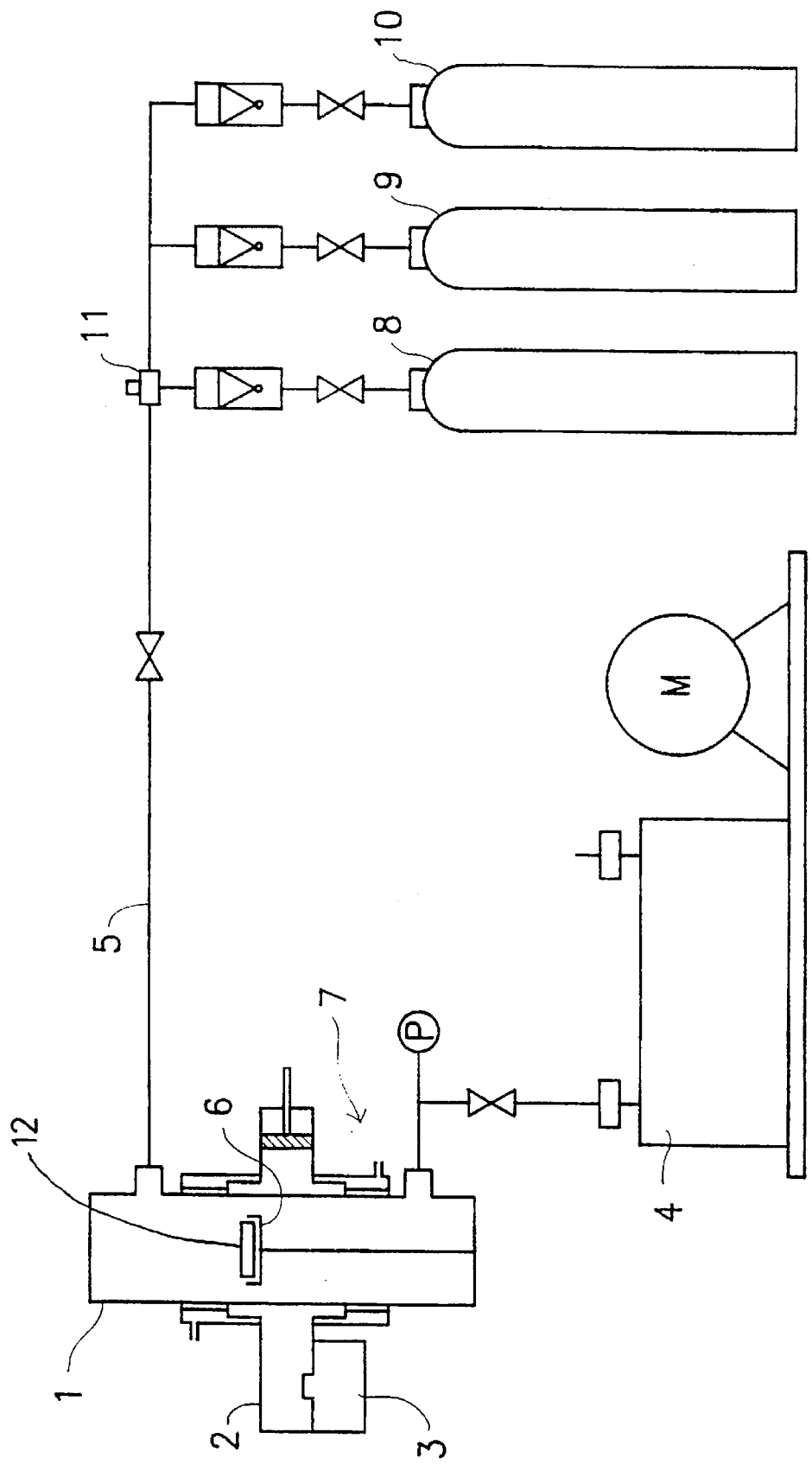
FIG. 1 is a schematic diagram showing the microwave plasma-assisted CVD apparatus for deposition according to the present invention.

The fabrication of a boron-doped diamond film on a substrate utilizes Chemical Vapor Deposition (CVD), such as microwave plasma-assisted CVD, R.F. plasma CVD, or hot filament CVD. In the following examples, the microwave plasma-assisted CVD method is used to deposit a boron doped diamond film on a substrate. A schematic diagram of the apparatus for performing this method is shown in FIG. 1. In this figure, the vertical chamber 1 consists of a quartz tube having a diameter of 50 mm and a length of 700 mm, hermetically closed at each end with a threaded removable cap. The tube is coupled with a magnetron (2.45 GHz) 3 by means of a waveguide 2. It is also connected at the bottom to a degassing line with a rotary pump 4 and at the top to a gas supply line 5. A quartz stick 7 extends through the bottom axially into the chamber 1 which supports at the top end a substrate carrier 6. The stick 7 may be slidable axially for level adjustment so as to hold substrate 12 in the region where power is concentrated, and for the convenience of substrate mounting and recovery of substrate. The reaction species, for example, $CO_2$ and $CH_4$, and trimethyl borate gas are supplied from their respective sources 8, 9, 10 via mass flow controllers 11. The gas pressure is monitored by a pressure sensor (MKS Baratron Capacitance Monometer, not shown). The substrate temperature is measured by a pyrometer (not shown).

EXAMPLE 1

The arrangement as illustrated in FIG. 1 was employed in this example. P-type and N-type silicon substrates (100) were first scratched by using diamond powder (average particle size, about 1-2 μm) to enhance the nucleation density during the deposition. The scratched substrates were then ultrasonically cleaned in acetone and ethanol.

The scratched and cleaned silicon substrate samples were then placed on the substrate carrier 6, and then raised into position in the quartz tube 1. During the deposition process, the substrate was heated up to 820° C. by keeping the microwave power at 400 W, the pressure in the quartz chamber 1 was maintained at 3.3 KPa (25 torr). The reaction species were $CH_4$ and $CO_2$. The flow rate of $CH_4$ was 21 sccm (standard cubic centimeter), and the flow rate of $CO_2$ is fixed at 30 sccm. A vapor source consisting of trimethyl borate diluted with methanol was introduced into the $CO_2$—$CH_4$ gas system. The concentration of trimethyl borate in gas phase was 0%. The duration of the deposition was one and half hours.

The surface morphology of the resulting boron-doped diamond films was observed by Scanning Electron Microscopy (SEM), and the qualitative analysis was examined by Raman Spectra. The boron concentration in the resultant diamond films was quantitatively determined by Secondary Ion Mass Spectrometry (SIMS).

Figure 2A:
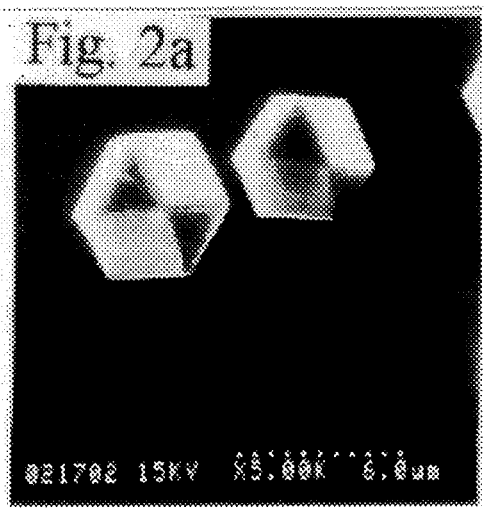
FIG. 2a is a SEM micrograph of diamond particles fabricated on a unscratched silicon substrate according to the method of Example 1.
Figure 2A:
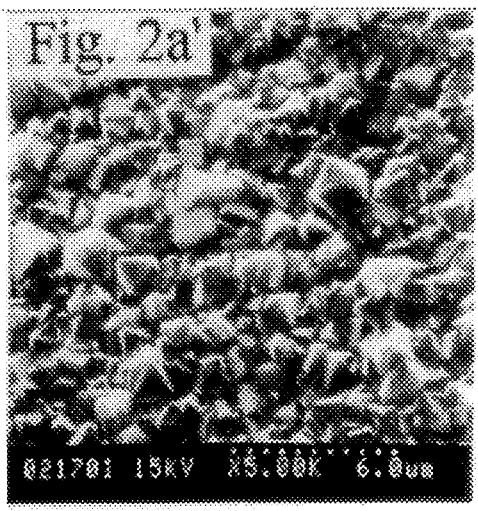

The SEM micrograph of diamond particles fabricated on unscratched silicon substrate is shown in FIG. 2a. The SEM micrograph of diamond film fabricated on a scratched silicon substrate is shown in FIG. 2a'. The Ranman spectra obtained are shown in (a) of FIG. 3. The CL spectra of diamond films obtained is shown in (a) of FIG. 5. A SEM micrograph of the surface of diamond film fabricated is shown in FIG. 6a. A color CL image of diamond film, taken at the same location as FIG. 6a for comparison, is shown in FIG. 6a'.

EXAMPLE 2

The same procedures as in Example 1 were employed to obtain diamond films on P-type or N-type substrates except that the flow rate of $CH_4$ was 20 sccm, and the flow rate of trimethyl borate, $B(OCH_3)_3$ was 0.03%.

Figure 2B:
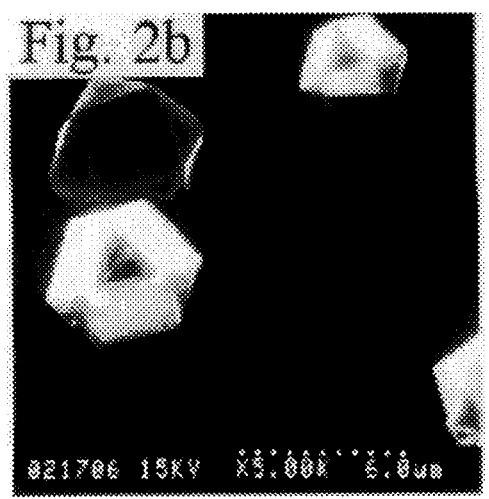
FIG. 2b is a SEM micrograph of diamond particles fabricated on a unscratched silicon substrate according to the method of Example 2.
Figure 2B:

The SEM micrograph of diamond particles fabricated on unscratched silicon substrate is shown in FIG. 2b. The SEM micrograph of diamond film fabricated on a scratched silicon substrate is shown in FIG. 2b'. The Ranman spectra obtained is shown in (b) of FIG. 3. The SIMS depth profile of the diamond film deposited on p-type substrate is shown in FIG. 4a. The SIMS depth profile of the diamond film deposited on n-type substrate is shown in FIG. 4a'. The CL spectra of diamond films obtained are shown in (b) of FIG. 5. A SEM micrograph of the surface of diamond film fabricated is shown in FIG. 6b. A color CL image of diamond film, taken at the same location as FIG. 6b for comparison, is shown in FIG. 6b'.

EXAMPLE 3

The same procedures as in Example 1 were employed to obtain diamond films on P-type or N-type substrates except that the flow rate of $CH_4$ was 20 sccm, the flow rate of $B(OCH_3)_3$ was 3.0%.

Figure 2C:
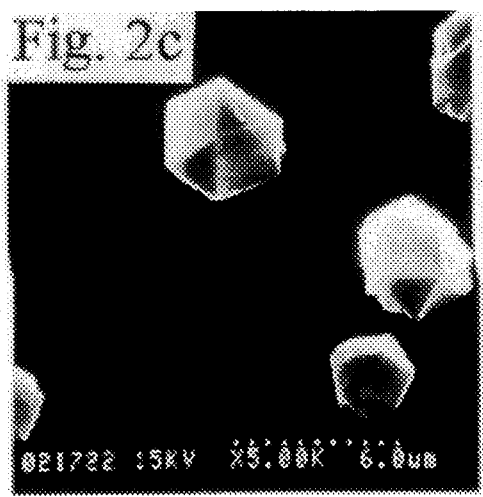
FIG. 2c is a SEM micrograph of diamond particles fabricated according to the method of Example 3.
Figure 2C:
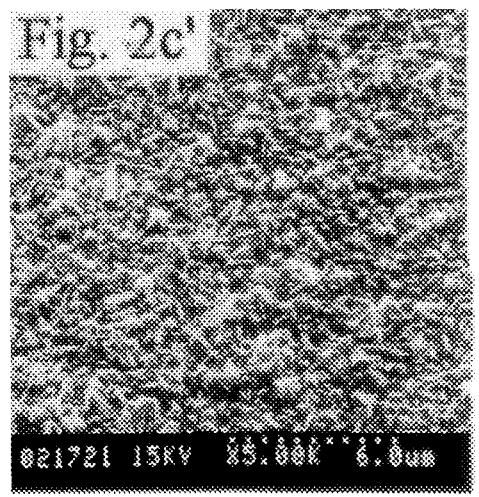

The SEM micrograph of diamond particles fabricated on unscratched silicon substrate is shown in FIG. 2c. The SEM micrograph of diamond film fabricated on a scratched silicon substrate is shown in FIG. 2c'. The Ranman spectra obtained are shown in (c) of FIG. 3. The SIMS depth profile of the diamond film deposited on p-type substrate is shown in FIG. 4b. The SIMS depth profile of the diamond film deposited on n-type substrate is shown in FIG. 4b'. The CL spectra of diamond films obtained are shown in (c) of FIG. 5. A SEM micrograph of the surface of diamond film fabricated is shown in FIG. 6c. A color CL image of diamond film, taken at the same location as FIG. 6c for comparison, is shown in FIG. 6c'.

It is clearly observed from FIGS. 2a, 2b and 2c that the diamond particles formed by Examples 1-3 all have well-defined facets even when the gas phase concentration of trimethyl borate is 3%. The surface morphology of undoped diamond films consists mainly of triangular (111) facets plus a few of (100) facets as shown in FIG. 2a. As the trimethyl borate concentration increased, the number of (100) facets dispersed in this (111) morphology decreased. Furthermore, with the increase in trimethyl borate concentration, the surface morphology changed from randomly oriented, triangular (111) facets to the pyramidal (111) facets. It is also clearly observed from FIGS. 2a', 2b' and 2c' that the diamond films formed by methods of Examples 1-3 all have good crystallinity.

Figure 3:
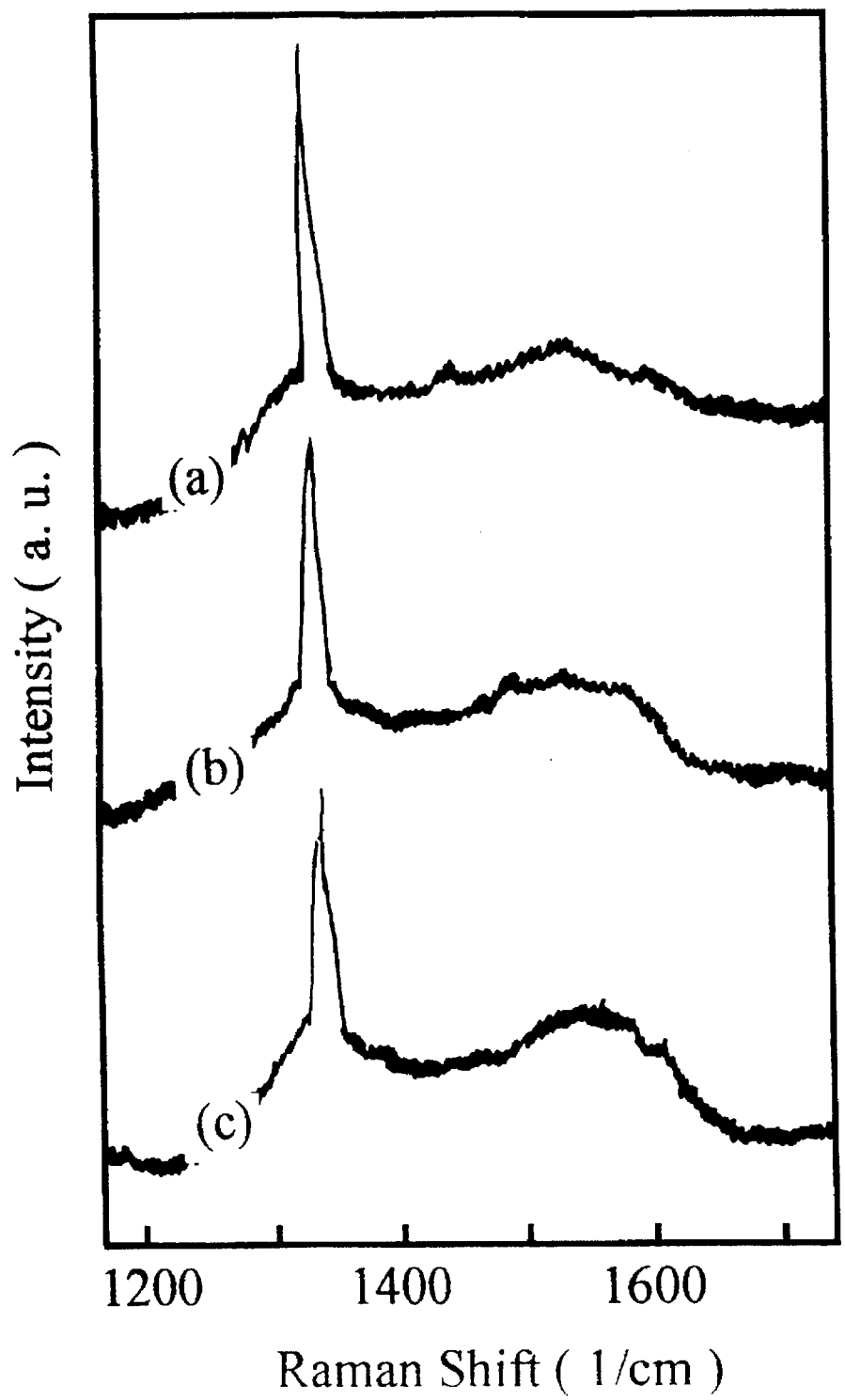
FIG. 3 is Raman spectra of diamond films fabricated by the methods of Examples 1–3.
Figure 4A:
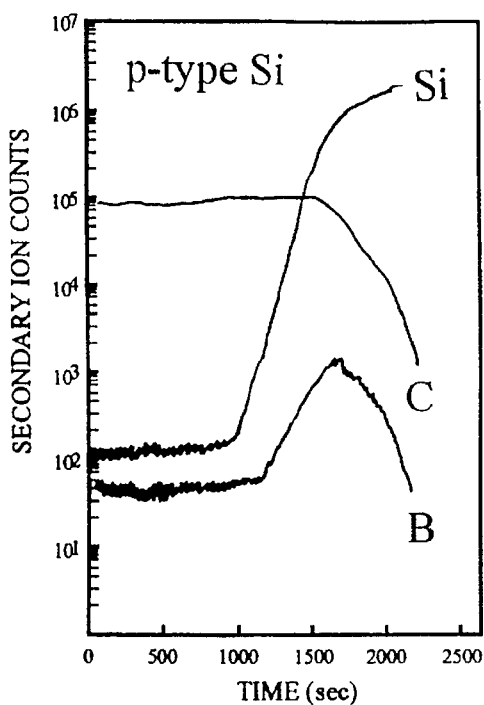
FIG. 4a is a SIMS depth profile of a diamond film deposited on a p-type substrate according to the method of Example 2.
Figure 4A:
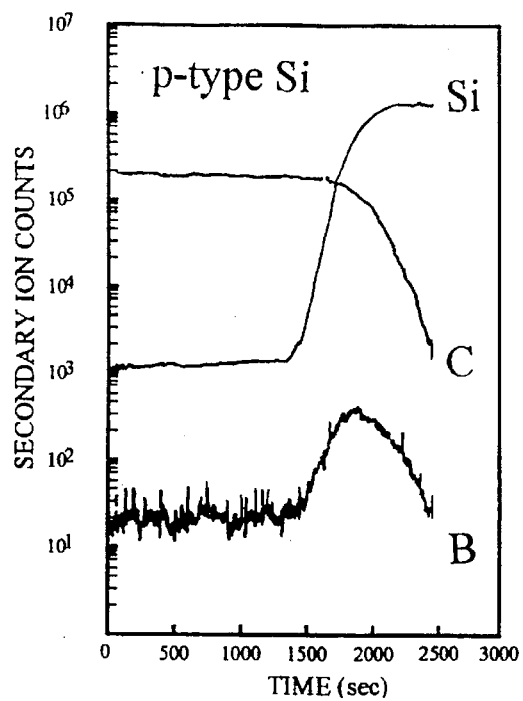
Figure 4B:
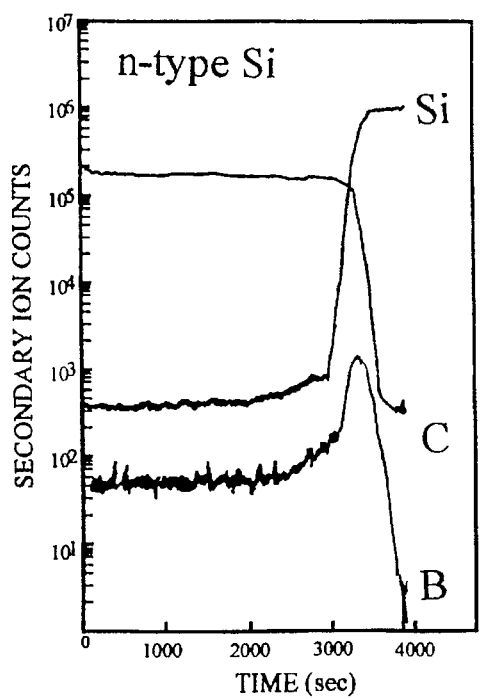
FIG. 4b is a SIMS depth profile of a diamond film deposited on a p-type substrate according to the method of Example 3.
Figure 4B:
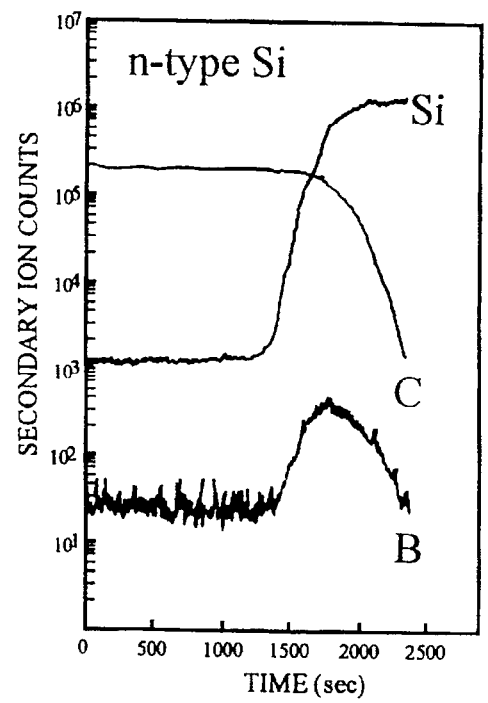

Referring to FIG. 3, the Raman spectra present three sharp features: (i) a sharp peak at 1332 $cm^{-1}$, which is the characteristic line of crystalline diamond, (ii) a broad peak centered at about 1550 $cm^{-1}$, which is characteristic diamond-like carbon and peaks at about 1350 $cm^{-1}$ and 1580$cm^{-1}$, which are characteristic of polycrystalline graphite or amorphous carbon with graphite bonding. It is seen from FIG. 3 that the broad peak centered at 1550 $cm^{-1}$ broadened with the increase of trimethyl borate concentration, indicating the increase of non-diamond phase. This is probably caused by an increase of $CH_3$— radicals which are considered to be the precursor during the diamond growth and which increase with an increase of trimethyl borate. The increase of $CH_3$—radicals reduces the etching rate of the non-diamond phase, and thus increase the amount of amorphous carbon or graphite remaining in the diamond phase.

As can be seen from FIGS. 4a, 4a', 4b and 4b', the boron concentration is largely increased near the diamond film/Si substrate interface, however, the boron is uniformly distributed throught the depth of the diamond films.

Figure 5:
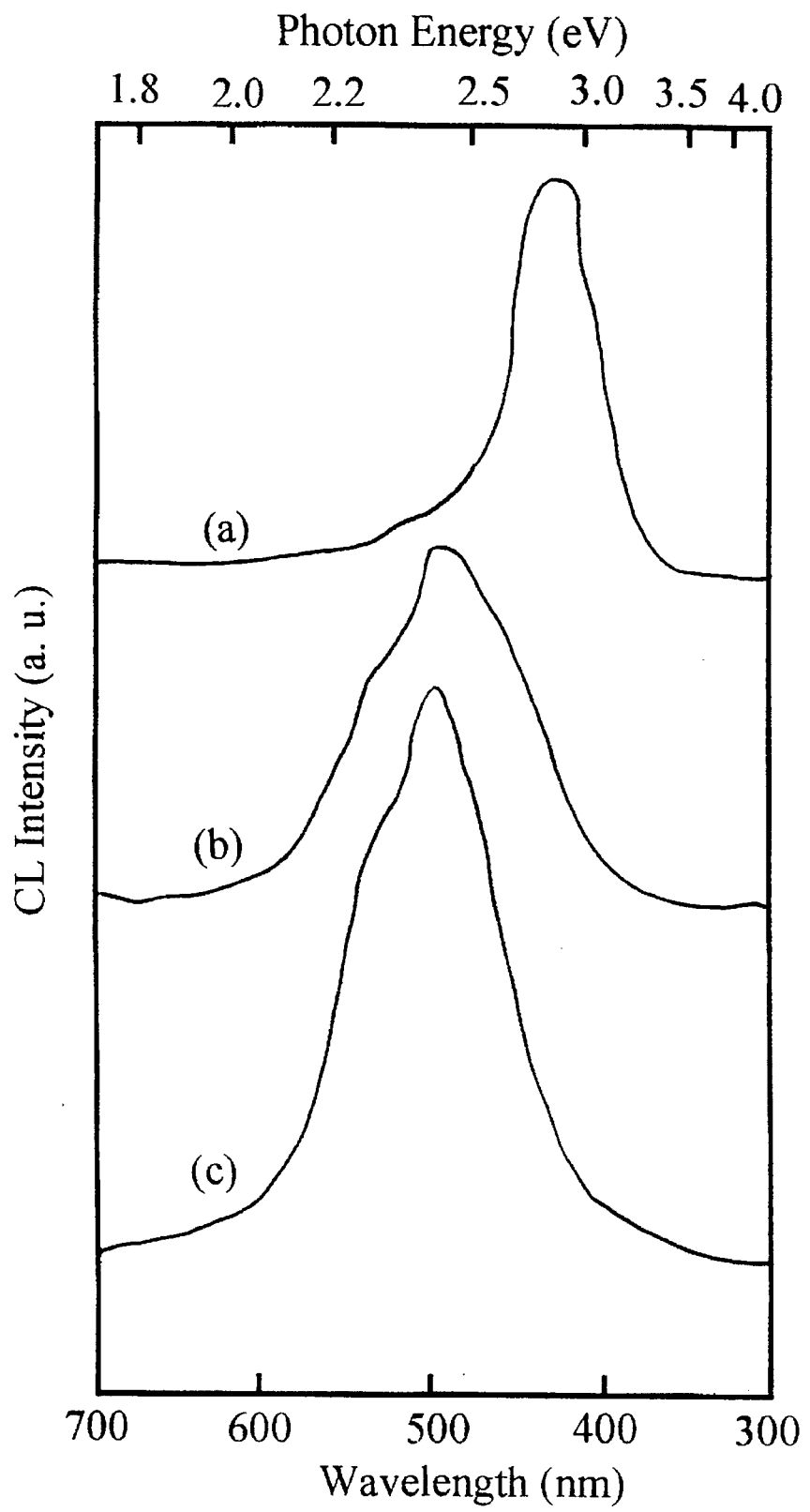
FIG. 5 is a CL (Cathodoluminescence) spectra of diamond films deposited according to the methods of Examples 1–3.

The effect of boron doping on the CL properties is shown in FIG. 5 and FIGS. 6a, 6a', 6b, 6b', 6c and 6c'. As shown in curve (a) of FIG. 5, the CL (Cathodoluminescence spectrum of undoped diamond shows a main emission peak at 2.8 eV. However, for boron-doped diamond films, as shown in curve (b) and curve (c), the emission peaks are located at 2.35–2.40 eV which are 0.40–0.45 eV below that of undoped sample, but the intensity is higher than that of the undoped diamond films. Referring to FIGS. 6a', 6b' and 6c', the luminescence changes from blue to green-yellow and the intensity increases as boron is doped into diamond films, are consistent with that observed in CL spectra. The uniform distribution of green-yellow color also shows that the boron atoms were uniformly doped into diamond films.

What is claimed is:

1. A method of fabricating boron doped diamond film on a substrate, comprising the following steps:

(a) providing a two-component system reactant gas, wherein the two-component system reactant gas is a gas selected from the group consisting of $C_xH_y$—$CO_2$, and $C_xH_yO_z$—$CO_2$, and said gas is doped with trimethyl borate, wherein x, y, and z represent integers;

(b) activating said trimethyl borate doped reactant gas by chemical vapor deposition process; and (c) exposing said substrate to said activated reactant gas, thus causing the growth of the boron doped diamond film on said substrate.

2. The method as claimed in claim 1, wherein said chemical vapor deposition process is a microwave plasma chemical vapor deposition process.

3. The method as claimed in claim 1, wherein said chemical vapor deposition process is a R.F. plasma chemical vapor deposition process.

4. The method as claimed in claim 1, wherein said chemical vapor deposition process is a hot filament chemical vapor deposition process.

5. The method as claimed in claim 1, wherein said two-component system reactant gas is a mixed gas of $CH_4$ and $CO_2$, and the flow ratio of $CO_2$ to $CH_4$ is 30: 20–22.

6. The method as claimed in claim 1, wherein the substrate is at a temperature of 180°–1000° C. and the reacting pressure is between 1 torr and 100 torr.

7. The method as claimed in claim 1, wherein the concentration of said trumethyl borate is 0.03 to 3 percent by volume based on the total reactant gas.

* * * * *